US007924104B2

(12) United States Patent
Huang et al.

(10) Patent No.: US 7,924,104 B2
(45) Date of Patent: Apr. 12, 2011

(54) METHODS AND APPARATUS FOR COMPENSATING A CLOCK BIAS IN A GNSS RECEIVER

(75) Inventors: Kung-Shuan Huang, Changhua County (TW); Yu-Chi Yeh, Taipei (TW)

(73) Assignee: Mediatek Inc., Hsin-chu (TW)

( * ) Notice: Subject to any disclaimer, the term of this patent is extended or adjusted under 35 U.S.C. 154(b) by 267 days.

(21) Appl. No.: 12/195,436

(22) Filed: Aug. 21, 2008

(65) Prior Publication Data

US 2010/0045523 A1 Feb. 25, 2010

(51) Int. Cl.
*H03L 1/00* (2006.01)
*H03L 1/02* (2006.01)
*G01S 19/39* (2010.01)

(52) U.S. Cl. ....... 331/65; 331/17; 331/176; 342/357.22; 342/357.39

(58) Field of Classification Search .................... 331/17, 331/65, 66, 176; 342/357.22, 357.39
See application file for complete search history.

(56) References Cited

U.S. PATENT DOCUMENTS

| | | | | |
|---|---|---|---|---|
| 6,670,915 | B1 | 12/2003 | McBurney et al. | |
| 7,019,689 | B1 | 3/2006 | McBurney et al. | |
| 7,098,748 | B2 * | 8/2006 | Schmidt | 331/176 |
| 7,123,190 | B1 * | 10/2006 | McBurney et al. | 342/357.15 |
| 7,148,761 | B1 | 12/2006 | Shieh | |
| 7,629,924 | B2 * | 12/2009 | Huang et al. | 342/357.02 |
| 2006/0214847 | A1 | 9/2006 | McBurney et al. | |

FOREIGN PATENT DOCUMENTS

| | | |
|---|---|---|
| CN | 1815256 | 8/2006 |
| CN | 101008672 | 8/2007 |

* cited by examiner

*Primary Examiner* — Robert Pascal
*Assistant Examiner* — James E Goodley
(74) *Attorney, Agent, or Firm* — Winston Hsu; Scott Margo

(57) ABSTRACT

A method for compensating a clock bias in a Global Navigation Satellite System (GNSS) receiver includes deriving at least one clock drift value comprising a first clock drift value corresponding to a first time point, and calculating the clock bias according to the at least one clock drift value and at least one interval within the time period between the first time point and a specific time point after the first time point. An apparatus for compensating a clock bias in a GNSS receiver is also provided.

16 Claims, 5 Drawing Sheets

METHODS AND APPARATUS FOR COMPENSATING A CLOCK BIAS IN A GNSS RECEIVER

BACKGROUND

The present invention relates to Global Navigation Satellite System (GNSS) receivers, and more particularly, to methods and apparatus for compensating a clock bias in a GNSS receiver.

One of the most important issues related to GNSS receivers is how to obtain accurate GNSS time when a GNSS receiver enters a start up mode from a power-off mode. Typically, within the GNSS receiver, all components except a real time clock (RTC) are powered down in the power-off mode. According to the related art, a common way to get an initial GNSS time when the GNSS receiver is powered on is by reading the RTC time provided by the RTC as the Coordinated Universal Time, which is typically referred to as the UTC time, and by further converting the UTC time derived from the RTC time into a rough initial value of the GNSS time directly.

Please note that the RTC is a temperature sensitive component with an RTC drift value that may change severely with respect to temperature, where an accumulated amount from the RTC drift value with respect to time can be referred to as the RTC bias value. As time goes by during a power-off period of the GNSS receiver, the RTC drift value accumulates and the RTC bias value becomes greater and greater, causing the aforementioned initial value of the GNSS time to be inaccurate.

SUMMARY

It is therefore an objective of the claimed invention to provide methods and apparatus for compensating a clock bias in a Global Navigation Satellite System (GNSS) receiver to solve the above-mentioned problem.

An exemplary embodiment of a method for compensating a clock bias in a GNSS receiver comprises: deriving at least one clock drift value comprising a first clock drift value corresponding to a first time point; and calculating the clock bias according to the at least one clock drift value and according to at least one interval within the time period between the first time point and a specific time point after the first time point.

An exemplary embodiment of an apparatus for compensating a clock bias in a GNSS receiver comprises a clock source and a processing module, where the processing module is coupled to the clock source. The clock source provides a time reference that has the clock bias to be compensated. In addition, the processing module is utilized for deriving at least one clock drift value comprising a first clock drift value corresponding to a first time point. Additionally, the processing module is utilized for calculating the clock bias according to the at least one clock drift value and according to at least one interval within the time period between the first time point and a specific time point after the first time point. For example, the clock source is a real time clock (RTC), and the clock bias is an RTC bias value.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
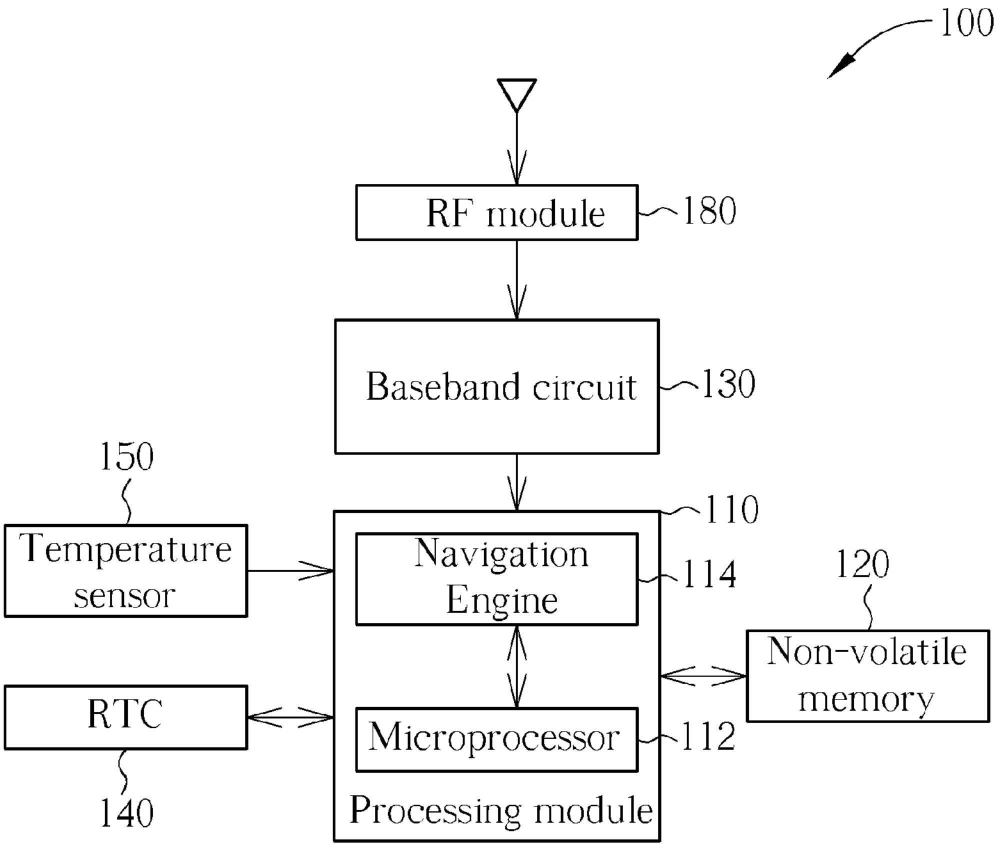
FIG. 1 is a diagram of an apparatus for compensating a clock bias in a Global Navigation Satellite System (GNSS) receiver according to a first embodiment of the present invention.

Please refer to FIG. 1. FIG. 1 is a diagram of an apparatus 100 for compensating a clock bias $B_{bias}$ in a Global Navigation Satellite System (GNSS) receiver according to a first embodiment of the present invention. According to an implementation choice of the first embodiment, the apparatus 100 may represent the GNSS receiver, but this is not a limitation of the present invention. According to another implementation choice of the first embodiment, the apparatus 100 may comprise the GNSS receiver. For example, the apparatus 100 can be a multi-function device comprising the cellular phone function, the personal digital assistant (PDA) function, and the GNSS receiver function. In another embodiment of the present invention, the apparatus 100 may represent a portion of the GNSS receiver.

According to the first embodiment, the apparatus 100 comprises a processing module 110, a non-volatile memory 120, a baseband circuit 130, a clock source, and an environmental sensor. As shown in FIG. 1, the clock source of this embodiment is a real time clock (RTC) 140 with the clock bias $B_{bias}$ representing the RTC bias value of the RTC 140. In addition, the environmental sensor of this embodiment is a temperature sensor 150. Additionally, the apparatus 100 further comprises an RF module 180.

According to the first embodiment, the baseband circuit 130 is capable of utilizing the RF module 180 to receive signals from GNSS satellites and further performing baseband processing according to derivative signals generated by the RF module 180. The processing module 110 of this embodiment comprises a microprocessor 112 and a navigation engine 114, where the microprocessor 112 is capable of performing overall control of the apparatus 100, while the navigation engine 114 is capable of performing detailed navigation operations according to processing results from the baseband circuit 130.

The GNSS receiver has to derive accurate time information in order to process the satellite signal. After each position fix, the processing module 110 may derive accurate time information. But when the GNSS receiver just wakes up from a power-off mode, the GNSS receiver may not derive accurate time information as per usual before the first position fix is obtained. In order to reduce the Time To First Fix (TTFF), the processing module 110 utilizes the time reference provided by the RTC 140 since the RTC 140 remains powered on during the power-off period. The processing module 110 of this embodiment derives accurate time information by properly calculating the clock bias $B_{bias}$, i.e., the RTC bias value of the RTC 140 in this embodiment.

According to this embodiment, the processing module 110 derives at least one clock drift value comprising a first clock drift value $D_0$ corresponding to a first time point, where each clock drift value is an RTC drift value of the RTC 140 in this embodiment. In addition, the processing module 110 calculates the clock bias $B_{bias}$ according to the at least one clock drift value and according to at least one interval within the time period between the first time point and a specific time point after the first time point. More particularly, the processing module 110 of this embodiment utilizes an environment-drift model and at least one detection result from the environmental sensor (i.e., the temperature sensor 150 in this embodiment) to derive at least one clock drift value, so that the clock bias $B_{bias}$ can be properly calculated and accurate time information can be derived accordingly. As a result, when the GNSS receiver starts up, the TTFF can be greatly reduced in contrast to the related art.

Figure 2:
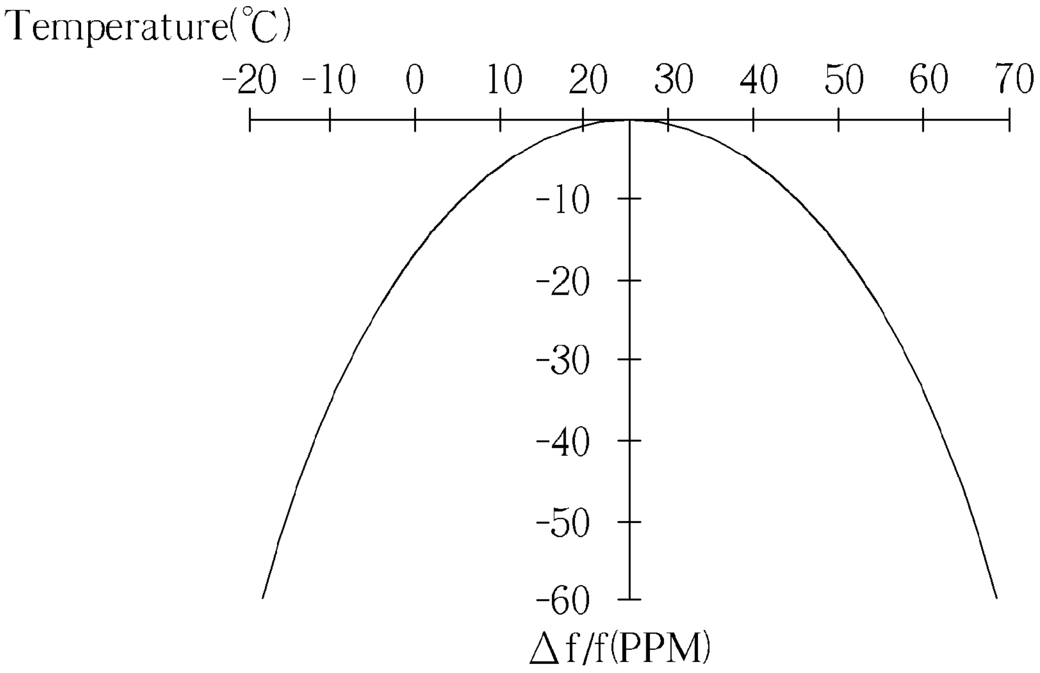
FIG. 2 illustrates a temperature-drift model utilized by the processing module shown in FIG. 1 according to one embodiment of the present invention.

FIG. 2 illustrates a temperature-drift model utilized by the processing module 110 shown in FIG. 1 according to one embodiment of the present invention, where the clock drift of this embodiment is illustrated in unit of parts per million (PPM) regarding an oscillator frequency f of the RTC 140. As the curve of the temperature-drift model is parabolic, the clock drift varies severely when the temperature is far from the symmetrical axis of the curve. By applying the temperature-drift model to the first embodiment, the clock bias $B_{bias}$ can be properly calculated, and therefore, accurate time information can be derived.

Figure 3:
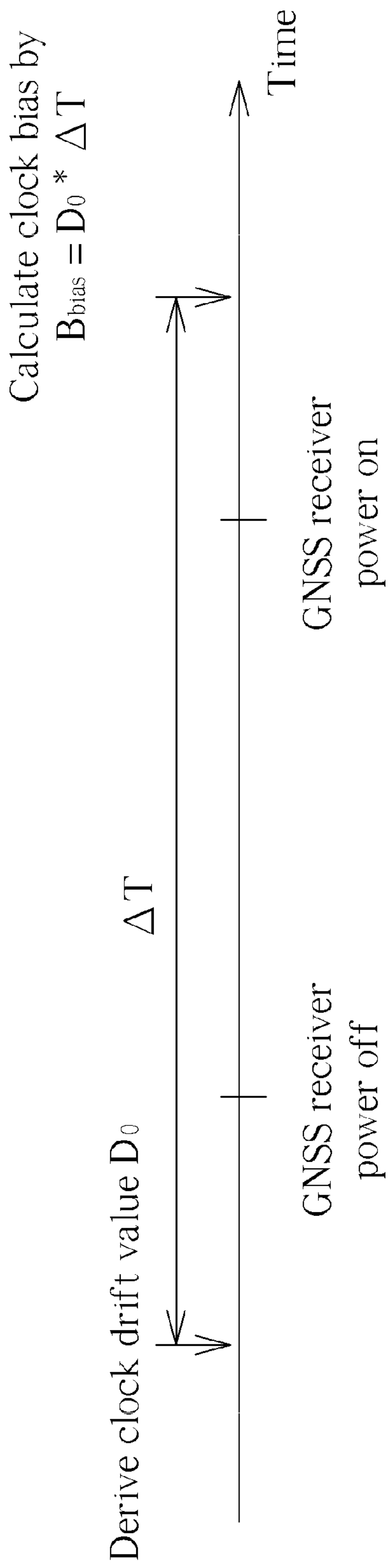
FIG. 3 illustrates a method for compensating a clock bias in a GNSS receiver according to an embodiment of the present invention.

FIG. 3 illustrates a method for compensating a clock bias in a GNSS receiver according to an embodiment of the present invention. The method shown in FIG. 3 can be implemented by utilizing the apparatus 100 shown in FIG. 1. As shown in FIG. 1, the processing module 110 derives the clock drift value $D_0$ corresponding to the first time point and stores the clock drift value $D_0$ into the non-volatile memory 120 before powering the GNSS receiver off. The clock drift value $D_0$ can be derived according to different implementation choices as follows.

According to a first implementation choice of this embodiment, as the GNSS receiver typically reaches nano-second level accuracy of GNSS time after the GNSS receiver obtains a valid position fix, the processing module 110 calculates the clock drift value $D_0$ by comparing the time reference of the RTC 140 with the accurate GNSS time.

According to a second implementation choice of this embodiment, the processing module 110 calculates the clock drift value $D_0$ by utilizing the environment-drift model such as the temperature-drift model shown in FIG. 2 according to the temperature detected from the temperature sensor 150.

After the GNSS receiver is powered on, at the specific time point, the processing module 110 temporarily sets the initial GNSS time as the RTC time derived from the time reference of the RTC 140 after the power-off period, calculates the clock bias $B_{bias}$, and compensates the initial GNSS time using the clock bias $B_{bias}$. The clock bias $B_{bias}$ is calculated by the following equation:

$$B_{bias}=D_0*\Delta T;$$

where ΔT represents the time period between the first time point and the specific time point. As the clock bias $B_{bias}$ can be properly calculated, accurate time information can be derived accordingly.

Figure 4:
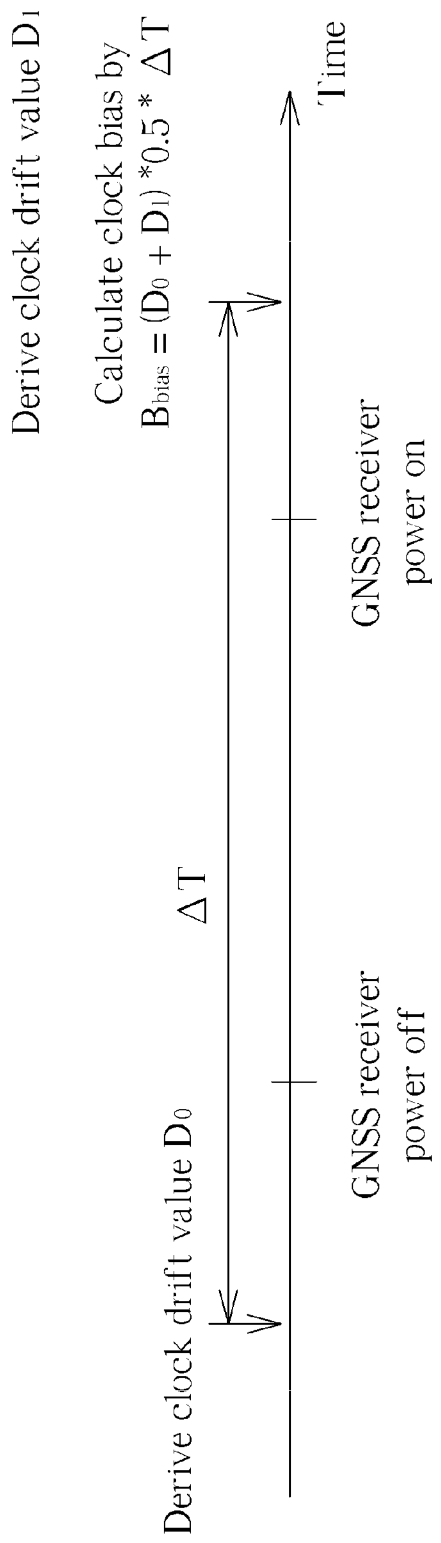
FIG. 4 illustrates a method for compensating a clock bias in a GNSS receiver according to another embodiment of the present invention, where this embodiment is a variation of the embodiment shown in FIG. 3.

FIG. 4 illustrates a method for compensating a clock bias in a GNSS receiver according to another embodiment of the present invention, where this embodiment is a variation of the embodiment shown in FIG. 3. The method shown in FIG. 4 can be implemented by utilizing the apparatus 100 shown in FIG. 1.

The clock drift value $D_0$ can be derived according to any of the two implementation choices of the embodiment shown in FIG. 3. After the GNSS receiver is powered on, the processing module 110 further derives another clock drift value $D_1$ as disclosed in the second implementation choice of the embodiment shown in FIG. 3, where the clock drift value $D_1$ corresponds to the specific time point. The processing module 110 temporarily sets the initial GNSS time as the RTC time derived from the time reference of the RTC 140 after the power-off period, calculates the clock bias $B_{bias}$, and compensates the initial GNSS time using the clock bias $B_{bias}$. The clock bias $B_{bias}$ is calculated by the following equation:

$$B_{bias}=(D_0+D_1)*0.5*\Delta T;$$

where ΔT represents the time period between the first time point and the specific time point.

Figure 5:
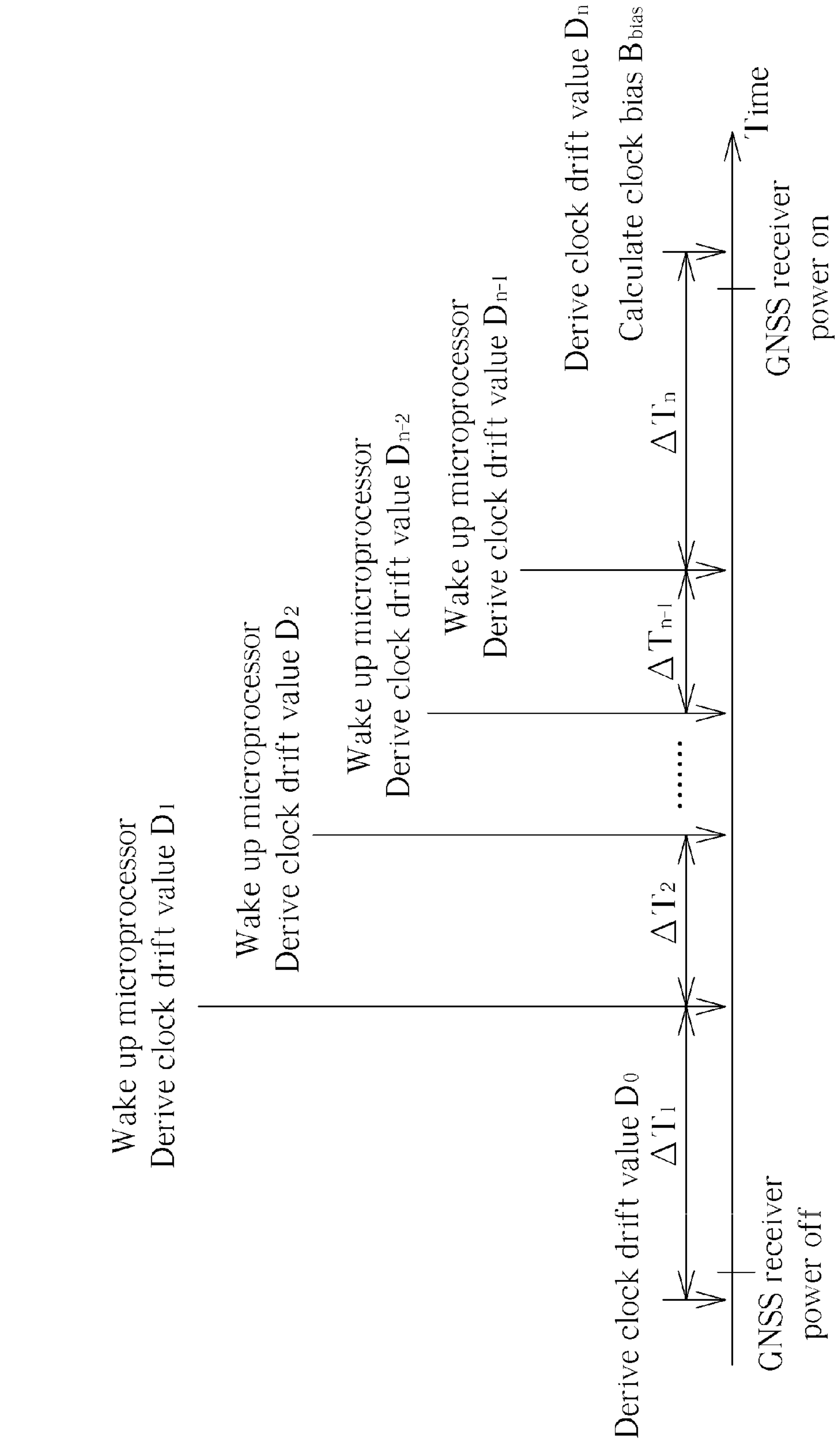
FIG. 5 illustrates a method for compensating a clock bias in a GNSS receiver according to another embodiment of the present invention, where this embodiment is another variation of the embodiment shown in FIG. 3.

FIG. 5 illustrates a method for compensating a clock bias in a GNSS receiver according to another embodiment of the present invention, where this embodiment is another variation of the embodiment shown in FIG. 3. The method shown in FIG. 5 can be implemented by utilizing the apparatus 100 shown in FIG. 1.

The clock drift value $D_0$ can be derived according to any of the two implementation choices of the embodiment shown in FIG. 3. During the power-off period, the apparatus 100 utilizes an RTC wake-up function of the RTC 140 to wake the processing module 110 (in particular, the microprocessor 112 therein) one or more times, in order to derive at least one clock drift value $D_1$ during the power-off period. More particularly, in this embodiment, the apparatus 100 utilizes the RTC wake-up function to wake the microprocessor 112 up a plurality of times, in order to derive clock drift values $D_1, D_2, \ldots, D_{n-2}$, and $D_{n-1}$. As shown in FIG. 5, the processing module 110 (the microprocessor 112 therein especially) calculates the clock drift value $D_N$ out of the clock drift values $D_1, D_2, \ldots, D_{n-2}$, and $D_{n-1}$ at their respective time points. Regarding the clock drift value $D_N$ with N=1, 2, . . . , (n−2), or (n−1), the processing module 110 utilizes the environment-drift model such as the temperature-drift model shown in FIG. 2 to convert a detection result (such as the temperature detected from the temperature sensor 150) into the clock drift value $D_N$. In addition, after the clock drift value $D_N$ is derived, the processing module 110 stores the clock drift value $D_N$ into the non-volatile memory 120 and then falls back asleep to save power.

After the GNSS receiver is powered on, the processing module 110 further derives another clock drift value $D_n$ in the same way as the clock drift values $D_1, D_2, \ldots, D_{n-2}$, and $D_{n-1}$, where the clock drift value $D_n$ corresponds to the specific time point. The processing module 110 temporarily sets the initial GNSS time as the RTC time derived from the time reference of the RTC 140 after the power-off period, calculates the clock bias $B_{bias}$, and compensates the initial GNSS time with the clock bias $B_{bias}$. Here, the clock bias $B_{bias}$ is calculated by the following equation:

$$B_{bias}=(D_0+D_1)*0.5*\Delta T_1+(D_1+D_2)*0.5*\Delta T_2+\ldots+(D_{n-1}+D_n)*0.5*\Delta T_n;$$

wherein $\Delta T_1$, $\Delta T_2$, . . . , and $\Delta T_n$ represent intervals between time points to which the plurality of clock drift values $D_0$, $D_1$, . . . , and $D_n$ correspond, respectively.

According to this embodiment, when an absolute value of a clock drift value $D_N$ out of the clock drift values $D_1$, $D_2$, . . . , and $D_{n-1}$ is greater than an absolute value of the previous clock drift value $D_{N-1}$, the processing module 110 sets the interval $\Delta T_{N+1}$ for deriving the next clock drift value $D_{N+1}$ to be less than the previous interval $\Delta T_N$. In addition, when an absolute value of a clock drift value $D_N$ out of the clock drift values $D_1$, $D_2$, . . . , and $D_{n-1}$ is less than an absolute value of the previous clock drift value $D_{N-1}$, the processing module 110 sets the interval $\Delta T_{N+1}$ for deriving the next clock drift value $D_{N+1}$ to be greater than the previous interval $\Delta T_N$ for deriving the clock drift value $D_N$. Furthermore, when an absolute value of a clock drift value $D_N$ out of the clock drift values $D_1$, $D_2$, . . . , and $D_{n-1}$ is equal to an absolute value of the previous clock drift value $D_{N-1}$, the processing module 110 sets the interval $\Delta T_{N+1}$ for deriving the next clock drift value $D_{N+1}$ to be the same as the previous interval $\Delta T_N$ for deriving the clock drift value $D_N$.

It should be noted that in this embodiment, although the processing module 110 may calculate one of the plurality of clock drift values at the time when one of the detection results is detected, this is not a limitation of the present invention. In a variation of this embodiment, at the time when one of the detection results is detected, the processing module 110 temporarily stores the detection result for further calculation to be performed at the specific time point, in order to save power more effectively during the power-off period. That is, at the respective time points mentioned above, the processing module 110 temporarily stores the temperature into the non-volatile memory 120 and then falls asleep, rather than storing the clock drift values $D_1$, $D_2$, . . . , and $D_{n-1}$. According to this variation, no calculation related to the clock drift values $D_1$, $D_2$, . . . , and $D_{n-1}$ is performed by the processing module 110 until the GNSS receiver is powered on again.

According to a second embodiment of the present invention, with this embodiment being a variation of the first embodiment, the aforementioned temperature sensor 150 is replaced with a vibration sensor. Thus, the aforementioned environment-drift model is a vibration-drift model, and the detection result represents vibration. Similar descriptions are not repeated for this embodiment.

According to a third embodiment of the present invention, with this embodiment being a variation of the first embodiment and also a variation of the second embodiment, the apparatus 100 comprises a plurality of environmental sensors such as the temperature sensor 150 and the aforementioned vibration sensor. Thus, the processing module 110 utilizes the respective environment-drift models (e.g., the temperature-drift model and the vibration-drift model) and respective detection results from the environmental sensors to derive at least one clock drift value. Similar descriptions are not repeated for this embodiment.

It is an advantage of the present invention that the present invention methods and apparatus properly calculates the clock bias $B_{bias}$ by utilizing the respective suitable equations as needed. When the environment (e.g., the temperature or the mechanical stability) changes abruptly, multiple clock drift values can be derived according to at least one environment-drift model, so the clock bias $B_{bias}$ can still be properly calculated. Therefore, accurate time information is derived after the power-off period.

It is another advantage of the present invention that the present invention methods and apparatus help subframe synchronization. As a result, when the GNSS receiver starts up, the TTFF can be greatly reduced in contrast to the related art.

Those skilled in the art will readily observe that numerous modifications and alterations of the device and method may be made while retaining the teachings of the invention.

What is claimed is:

1. A method for compensating a clock bias in a Global Navigation Satellite System (GNSS) receiver, the method comprising:

deriving a first clock drift value corresponding to a first time point before a power-off period of the GNSS receiver;

deriving at least one power off clock drift value during the power-off period of the GNSS receiver; and calculating the clock bias between the first time point and a second time point after on the power-off period of the GNSS receiver according to the first clock drift and the at least one power off clock drift value.

2. The method of claim 1, further comprising:

deriving a second clock drift value at the second time point; and calculating the clock bias according to the first clock drift value, the at least one power off clock drift value, and the second clock drift value.

3. The method of claim 2, wherein the clock bias is calculated by the following equation:

$$B_{bias}=(D_0+D_1)*0.5\Delta T_1+(D_1+D_2)*0.5*\Delta T_2+\ldots+(D_{n-1}+D_n)*0.5*\Delta T_n;$$

wherein $D_0$ representing the first clock drift value; $D_1$~$D_{n-1}$ representing the power off clock drift values, $D_n$ representing the second clock drift value, $B_{bias}$ represents the clock bias, and $\Delta T_1$, $\Delta T_2$, . . . , and $\Delta T_n$ represent intervals between time points to collected each of the plurality of power off clock drift values $D_0$, $D_1$, . . . , and $D_n$ respectively.

4. The method of claim 3, wherein the step of calculating the clock bias further comprises:

when an absolute value of a power off clock drift value $D_N$ is greater than an absolute value of a previous power off clock drift value $D_{N-1}$, setting the interval $\Delta T_{N+1}$ for deriving the next power off clock drift value $D_{N+1}$ to be less than the previous interval $\Delta T_N$ for deriving the power off clock drift value $D_N$; and when an absolute value of a clock drift value $D_N$ is less than an absolute value of a previous power off clock drift value $D_{N-1}$, setting the interval $\Delta T_{N+1}$ for deriving the next power off clock drift value $D_{N+1}$ to be greater than the previous interval $\Delta T_N$ for deriving the power off clock drift value $D_N$.

5. The method of claim 1, further comprising:

utilizing an environment-drift model and at least one detection result from an environmental sensor to derive the at least one clock drift value.

6. The method of claim 5, wherein the environmental sensor is a temperature sensor, the environment-drift model is a temperature-drift model, and the detection result represents temperature.

7. The method of claim 5, wherein the environmental sensor is a vibration sensor, the environment-drift model is a vibration-drift model, and the detection result represents vibration.

8. The method of claim 5, wherein the at least one detection result comprises a plurality of detection results, and the method further comprises:

at the time when one of the detection results is detected, temporarily storing the detection result for further calculation to be performed at the specific time point; and calculating one of the plurality of clock drift values at the time when one of the detection results is detected.

9. An apparatus for compensating a clock bias in a Global Navigation Satellite System (GNSS) receiver, the apparatus comprising:

a clock source providing a time reference that has the clock bias to be compensated; and a processing module, coupled to the clock source, for deriving a first clock drift value corresponding to a first time point before a power-off period of the GNSS receiver; deriving at least one power off clock drift value during the power-off period of the GNSS receiver; and calculating the clock bias between the first time point and a second time point after the power-off period of the GNSS receiver according to the first clock drift and the at least one power off clock drift value.

10. The apparatus of claim 9, further comprising:

wherein the processing module derive a second clock drift value at the second time point; and calculate the clock bias according to the first clock drift value, the at least one power off clock drift value, and the second clock drift value.

11. The apparatus of claim 10, wherein the clock bias is calculated by the following equation:

$$B_{bias}=(D_0+D_1)*0.5*\Delta T_1+(D_1+D_2)*0.5*\Delta T_2+\ldots+(D_{n-1}+D_n)*0.5*\Delta T_n;$$

wherein $D_0$ representing the first clock drift value; $D_1$~$D_{n-1}$ representing the power off clock drift values, $D_n$ representing the second clock drift value, $B_{bias}$ represents the clock bias, and $\Delta T_1$, $\Delta T_2$, . . . , and $\Delta T_n$ represent intervals between time points to collected each of the plurality of power off clock drift values $D_0$, $D_1$, . . . , and $D_n$ respectively.

12. The apparatus of claim 11, wherein the processing module calculating the clock bias further comprises:

when an absolute value of a power off clock drift value $D_N$ is greater than an absolute value of a previous power off clock drift value $D_{N-1}$, setting the interval $\Delta T_{N+1}$ for deriving the next power off clock drift value $D_{N+1}$ to be less than the previous interval $\Delta T_N$ for deriving the power off clock drift value $D_N$; and when an absolute value of a clock drift value $D_N$ is less than an absolute value of a previous power off clock drift value $D_{N-1}$, setting the interval $\Delta T_{N+1}$ for deriving the next power off clock drift value $D_{N-1}$ to be greater than the previous interval $\Delta T_N$ for deriving the power off clock drift value $D_N$.

13. The apparatus of claim 9, further comprising:

an environmental sensor;

wherein the processing module utilizes an environment-drift model and at least one detection result from the environmental sensor to derive at least one clock drift value.

14. The apparatus of claim 13, wherein the environmental sensor is a temperature sensor, the environment-drift model is a temperature-drift model, and the detection result represents temperature.

15. The apparatus of claim 13, wherein the environmental sensor is a vibration sensor, the environment-drift model is a vibration-drift model, and the detection result represents vibration.

16. The apparatus of claim 13, wherein the at least one detection result comprises a plurality of detection results, and at the time when one of the detection results is detected, the processing module temporarily stores the detection result for further calculation to be performed at the specific time point; and wherein the at least one detection result comprises a plurality of detection results, and the processing module calculates one of the plurality of clock drift values at the time when one of the detection results is detected.

* * * * *